United States Patent
Kang

(10) Patent No.: US 7,885,141 B2
(45) Date of Patent: Feb. 8, 2011

(54) NON-VOLATILE MEMORY DEVICE AND METHOD FOR SETTING CONFIGURATION INFORMATION THEREOF

(75) Inventor: Eun-suk Kang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1096 days.

(21) Appl. No.: 11/636,325

(22) Filed: Dec. 8, 2006

(65) Prior Publication Data

US 2008/0126735 A1   May 29, 2008

(30) Foreign Application Priority Data

Nov. 3, 2006   (KR) ...................... 10-2006-0108526

(51) Int. Cl.
*G11C 7/10* (2006.01)

(52) U.S. Cl. .............................. 365/238.5; 365/189.06; 365/189.07; 365/240

(58) Field of Classification Search ............ 365/189.01, 365/238.5, 240, 189.06, 189.07
See application file for complete search history.

(56) References Cited

U.S. PATENT DOCUMENTS 7,130,211 B2 * 10/2006 Kang .......................... 365/145
7,433,246 B2 * 10/2008 Lee ........................ 365/189.14
2005/0144362 A1 * 6/2005 Lin et al. ..................... 711/103

FOREIGN PATENT DOCUMENTS

| JP | 2000-173281 | 6/2000 |
| JP | 2001-006374 | 1/2001 |
| JP | 2003-022687 | 1/2003 |

* cited by examiner

*Primary Examiner*—Pho M Luu
(74) *Attorney, Agent, or Firm*—Myers Bigel Sibley & Sajovec, P.A.

(57) ABSTRACT

Provided are a nonvolatile memory device and a method for setting configuration information of the nonvolatile memory device. The nonvolatile memory device can include a nonvolatile memory cell array, a configuration register and a configuration controller. The configuration controller can be configured to set configuration information in the configuration register based on the state of a select flag stored in the nonvolatile memory cell array. The nonvolatile memory device can be configured to maintain the configuration information using the select flag and a lock flag to prevent the configuration information from changing when security is utilized and reduce the likelihood of the nonvolatile memory device operating erroneously.

18 Claims, 6 Drawing Sheets

NON-VOLATILE MEMORY DEVICE AND METHOD FOR SETTING CONFIGURATION INFORMATION THEREOF

CROSS-REFERENCE TO RELATED PATENT APPLICATION

This application claims the benefit of Korean Patent Application No. 10-2006-0108526, filed on Nov. 3, 2006, in the Korean Intellectual Property Office, the disclosure of which is incorporated herein in its entirety by reference.

FIELD OF THE INVENTION

The present invention relates to nonvolatile memory devices, and more particularly, to devices and methods of configuring nonvolatile memory devices.

BACKGROUND

A nonvolatile memory device that is electrically erasable and programmable can preserve data stored therein even when it is not provided with power. Particularly, a NAND type flash memory can be inexpensive because it has a string structure in which a plurality of memory cells are connected in series. Thus, the NAND type flash memory can be used as a data memory in various portable devices.

Systems employing a nonvolatile memory device utilize configuration information, and thus operations for setting configuration information suitable for the systems are performed when the systems power-up. The configuration information includes synchronization latency, MRS, burst read latency, burst write latency and so on.

A general method of setting configuration information of a nonvolatile memory device includes storing the configuration information in a configuration register. However, this method records the configuration information whenever the system using the nonvolatile memory device powers-up thus making it inconvenient to set the configuration information. Furthermore, the configuration information can be changed in spite of a case that the configuration information should not be changed in view of security.

With the development of nonvolatile memory technology, nonvolatile memory devices capable of storing multiple bits in a single memory cell have become widely used. A single memory cell of the nonvolatile memory can store a single bit or multiple bits, and thus a single-bit region and a multi-bit region of a nonvolatile memory cell array can be set in a system using the nonvolatile memory. In this case, memory cells corresponding to the single-bit region can each store a single bit and memory cells corresponding to the multi-bit region each store multiple bits.

A method of setting information for setting the single-bit region and the multi-bit region is similar to the method of setting configuration information. Accordingly, the information for setting the single-bit region and the multi-bit region and the configuration information can be simultaneously set or separately set. Specifically, when the configuration information includes the region setting information, all the memory cells of a nonvolatile memory can be set to a single-bit region and a multi-bit region whenever a system using the nonvolatile memory is in power-up mode, and then the region setting information is recorded in a configuration register. The region setting information represents a part of the memory cell array corresponding to the single-bit region and a part of the memory cell array corresponding to the multi-bit region.

When the configuration information and the region setting information are set using the aforementioned method, however, the configuration information can be externally changed. Furthermore, the configuration information may be corrupted due to signal noise. Accordingly, the system using the configuration information may operate erroneously.

SUMMARY

In some embodiments according to the invention, a nonvolatile memory device can include a nonvolatile memory cell array, a configuration register, and a configuration controller that is configured to set configuration information for the nonvolatile memory cell array in the configuration register in response to a select flag stored in the nonvolatile memory cell array.

In some embodiments according to the invention, a nonvolatile memory device includes a nonvolatile memory cell array that is configured to change a single-bit region to a multi-bit region and/or that is configured to change the multi-bit region to the single-bit region. A region setting register is configured to store region setting information of the single-bit region and the multi-bit region and a region setting controller is configured to provide the region setting information to the region setting register based on the state of a select flag stored in the nonvolatile memory cell array.

In some embodiments according to the invention, a configuration device includes a configuration register that is configured to store configuration information and a configuration controller that is configured to set the configuration information using configuration information stored in a configuration information area of a nonvolatile memory cell array.

BRIEF DESCRIPTION OF THE DRAWINGS

The above and other features and advantages of the present invention will become more apparent by describing in detail exemplary embodiments thereof with reference to the attached drawings in which.

DESCRIPTION OF EMBODIMENTS ACCORDING TO THE INVENTION

Figure 1:
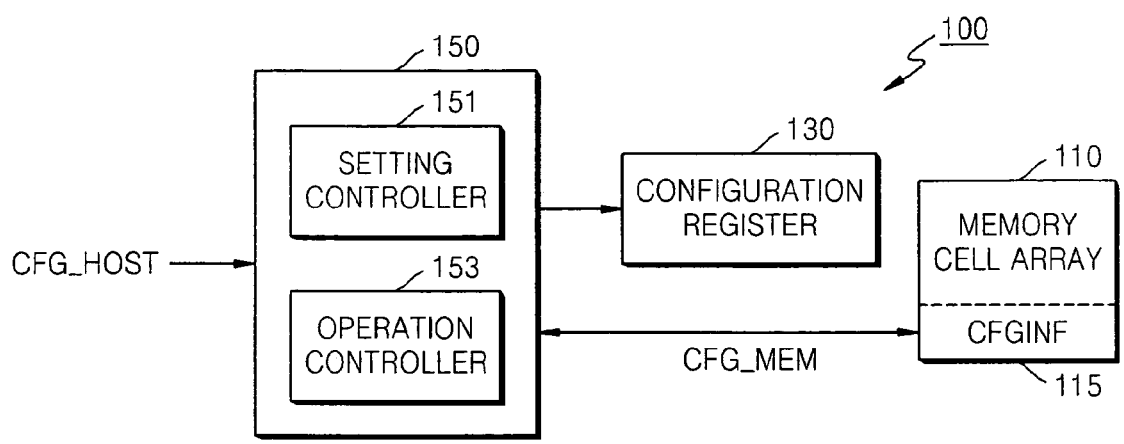
FIG. 1 is a block diagram of a nonvolatile memory device in some embodiments according to the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

FIG. 1 is a block diagram of a nonvolatile memory device 100 in some embodiments according to the present invention. Referring to FIG. 1, the nonvolatile memory device 100 includes a memory cell array 10, a configuration information area 115 of the memory cell array 110, a configuration register 130 and a configuration controller 150.

In some embodiments according to the present invention, the memory cell array 110 is a nonvolatile memory cell array so that it is assumed that the memory cell array 100 is a nonvolatile memory cell array in the current embodiment.

The nonvolatile memory cell array 110 is configured to change a single-bit region to a multi-bit region or change the multi-bit region to the single-bit region. In this case, region setting information for setting the single-bit region and the multi-bit region is set for the respective operation, as described herein.

As illustrated in FIG. 1, a predetermined part of the nonvolatile memory cell array 110 is allocated to the configuration information area 115 storing configuration information CFGINF. A single block or a single page of the nonvolatile memory cell array 110 is allocated to the configuration information area 115 in the current embodiment.

The configuration information CFGINF stored in the configuration information area 115 includes at least one sub configuration information, a select flag and a lock flag. The sub configuration information may include synchronization latency, MRS, burst read latency, burst write latency and region setting information. In some embodiments according to the present invention, the configuration information CFGINF is stored in the configuration information area 115 in the form illustrated in FIG. 2.

Figure 2:
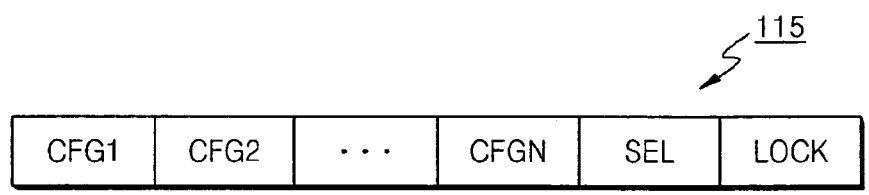
FIG. 2 illustrates the structure of a configuration information area of a memory cell array of the nonvolatile memory device illustrated in FIG. 1 in some embodiments according to the present invention.

FIG. 2 illustrates the structure of the configuration information area 115 of the memory cell array illustrated in FIG. 1 in some embodiments according to the present invention. Referring to FIG. 2, the configuration information area 115 includes at least one sub configuration information region respectively storing at least one sub configuration information CFG1 through CFGN, a select flag region storing the select flag SEL, and a lock flag region storing the lock flag LOCK.

The configuration register 130 stores configuration information of a system (not shown) using the nonvolatile memory cell array 110. Particularly, the configuration register 130 stores configuration information utilized for accessing the nonvolatile memory cell array 110.

Figure 3:
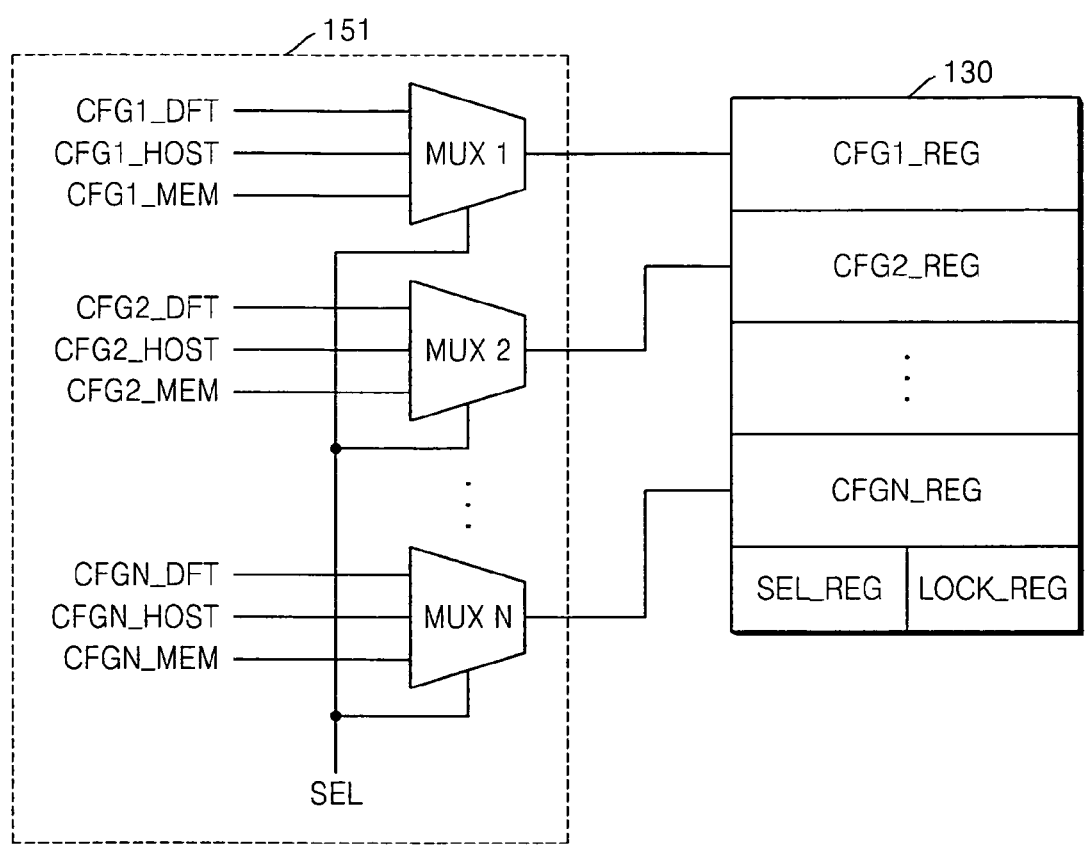
FIG. 3 illustrates a configuration register and a setting controller of the nonvolatile memory device illustrated in FIG. 1 in some embodiments according to the present invention.

FIG. 3 illustrates the configuration register 130 and a setting controller 151 of the nonvolatile memory device illustrated in FIG. 1 in some embodiments according to the present invention. Referring to FIG. 3, the configuration register 130 includes at least one sub configuration register CFG1_REG through CFGN_REG for respectively storing at least one sub configuration information, a select flag register SEL_REG and a lock flag register LOCK_REG. The at least one sub configuration register CFG1_REG through CFGN_REG, the select flag register SEL_REG and the lock flag register LOCK_REG may correspond to the configuration information area 115 of the nonvolatile memory cell array 110.

The configuration controller 150 illustrated in FIG. 1 sets configuration information to the configuration register 130 in response to the select flag SEL stored in the nonvolatile memory cell array 110. The operation of the configuration controller 150 to set the configuration information is described, for example, in reference to FIGS. 4 through 8.

Referring to FIG. 1, the configuration register 150 includes an operation controller 153 and the setting controller 151. The operation controller 153 performs read, erase and programming operations with respect to the configuration information area 115. The operation controller 153 determines whether the erase operation or the programming operation is executed according to whether the lock flag LOCK is set or not. The read, erase and programming operations are well-known in the art so that detailed explanations thereof are omitted.

The setting controller 151 outputs the configuration information to the configuration register 130 to set the configuration information. The operation of outputting the configuration information set by the setting controller 151 is explained with reference to FIG. 3.

The setting controller 151 includes at least one sub setting controller MUX1 through MUXN respectively corresponding to the at least one sub configuration register CFG1_REG through CFGN_REG of the configuration register 130. The sub setting controller MUX1 through MUXN may be a multiplexer operating in response to the select flag SEL.

The sub setting controller MUX1 through MUXN outputs sub configuration information to the corresponding sub configuration register in response to the select flag SEL. For example, the sub setting controller MUX1 through MUXN determines whether default configuration information CFG1_DF through CFGN_DFT is output or sub configuration information CFG1_MEM through CFGN_MEM read from the configuration information region 115 of the nonvolatile memory cell array 110 is output according to whether the select flag SEL is set or not when the nonvolatile memory device powers-up.

Methods for setting configuration information in the nonvolatile memory device according to some embodiments of the present invention are explained with reference to FIGS. 4, 5, 6 and 7.

Figure 7:
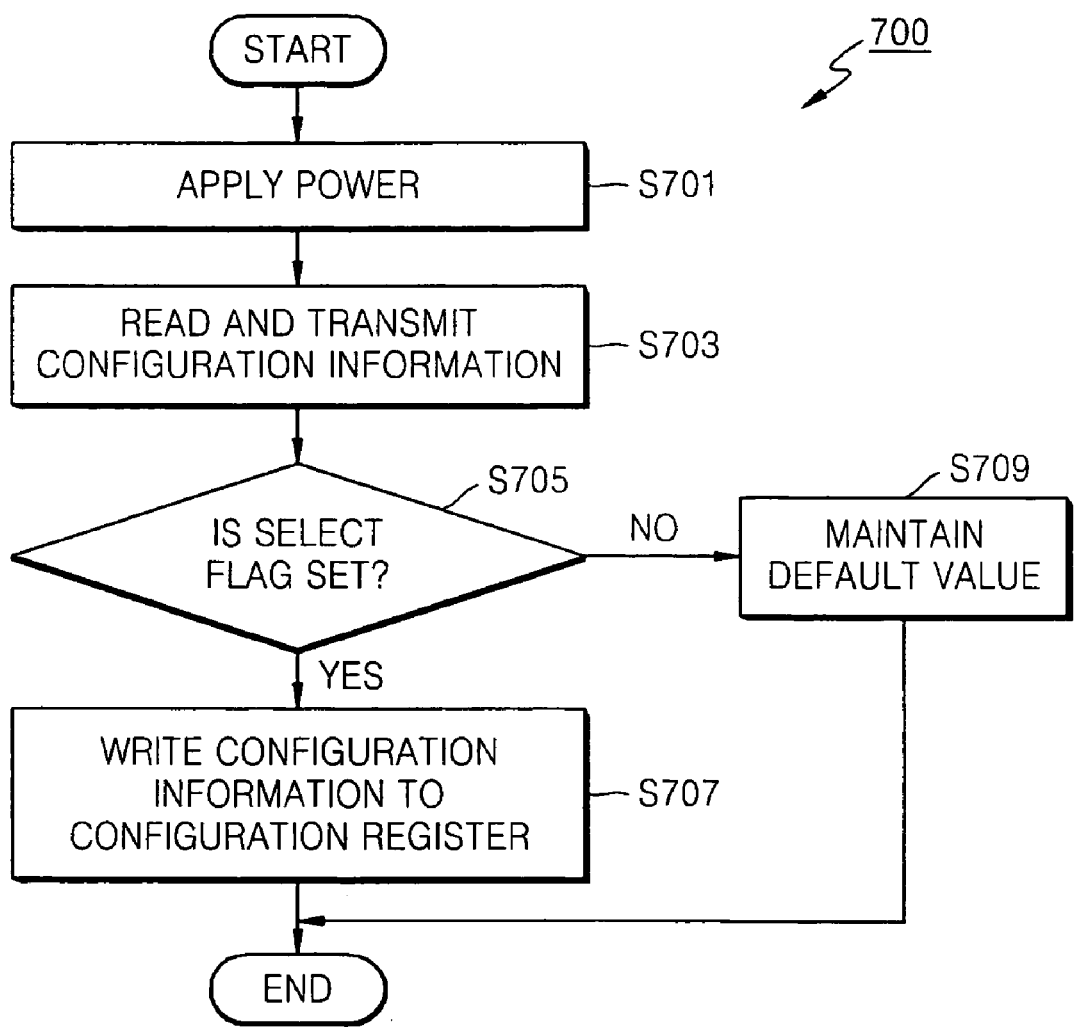
FIG. 7 is a flow chart of an operation of setting configuration information when a nonvolatile memory device is in power-up in the method for setting configuration information in some embodiments according to the present invention.

The operation of the nonvolatile memory device when the nonvolatile memory device powers-up are explained with reference to FIGS. 1 and 7. FIG. 7 is a flow chart of an operation of setting configuration information when the nonvolatile memory device powers-up in the method of setting configuration information according in some embodiments according to the present invention.

When the nonvolatile memory device powers-up in operation S701, the configuration controller 150 reads configuration information CFGINF stored in the configuration information area 115 of the nonvolatile memory cell array 110, that is, at least one sub configuration information unit CFG1 through CFGN, a select flag SEL and a lock flag LOCK, and then sets configuration information according to whether the select flag SEL is set or not. Specifically, the operation controller 153 reads the configuration information CFGINF stored in the configuration information area 115 and transmits the configuration information CFGINF to the setting controller 151 in operation S703.

Figure 6:
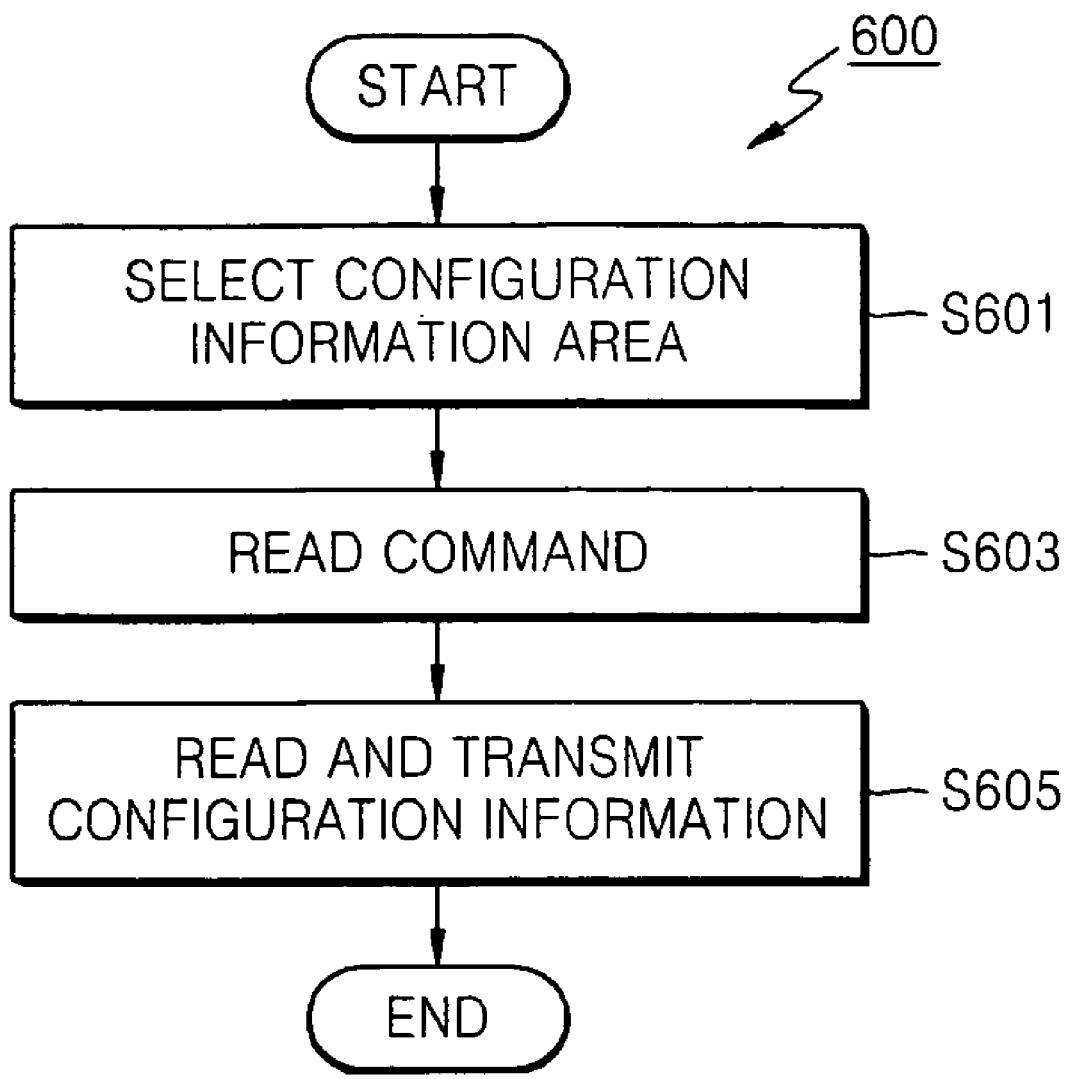
FIG. 6 is a flow chart of an operation of reading configuration information in a method for setting configuration information in some embodiments according to the present invention.

FIG. 6 is a flow chart of the operation of reading configuration information in the method for setting configuration information according to an embodiment of the present invention. Referring to FIG. 6, the operation controller 153 selects the configuration information area 115 in the operation S601 and performs a read command on the selected configuration information area 115 in operation S603. Then, the operation controller 153 transmits the configuration information CFGINF to the setting controller 151 in operation S605.

Referring back to FIG. 7, the setting controller 151 determines whether the select flag SEL of the configuration information CFGINF is set (for example, whether the select flag SEL is 1 or 0) in operation S705. When the select flag SEL is set (for example, when the select flag SEL is 1), the setting controller 151 outputs sub configuration information CFG1_MEM through CFGN_MEM included in the configuration information CFGINF to the configuration register 130 to set the sub configuration information CFG1_MEM through CFGN_MEM as the configuration information.

When the select flag SEL is not set (for example, when the select flag SEL is 0), the setting controller 151 maintains default configuration information CFG1_DFT through CFGN_DFT. In general, the setting controller 151 maintains the value of the configuration register 130 because the default configuration information CFG1_DFT through CFGN_DFT is stored in the configuration register 130 when the nonvolatile memory device powers-up. However, the operation of the setting controller 151 when the select flag SEL is not set can be constructed in various forms. For example, the setting controller 151 can be constructed such that it outputs the default configuration information CFG1_CFT through CFGN_DFT to the configuration register 130 when the select flat SEL is not set (for example, when the select flag SEL is 0).

Referring again to FIG. 3, the respective sub setting controllers MUX output the default configuration information CFG1_DFT through CFGN_DFT and the configuration information CFGINF to the corresponding sub configuration registers CFG1_REG through CFGN_REG when the nonvolatile memory device powers-up.

Figure 8:
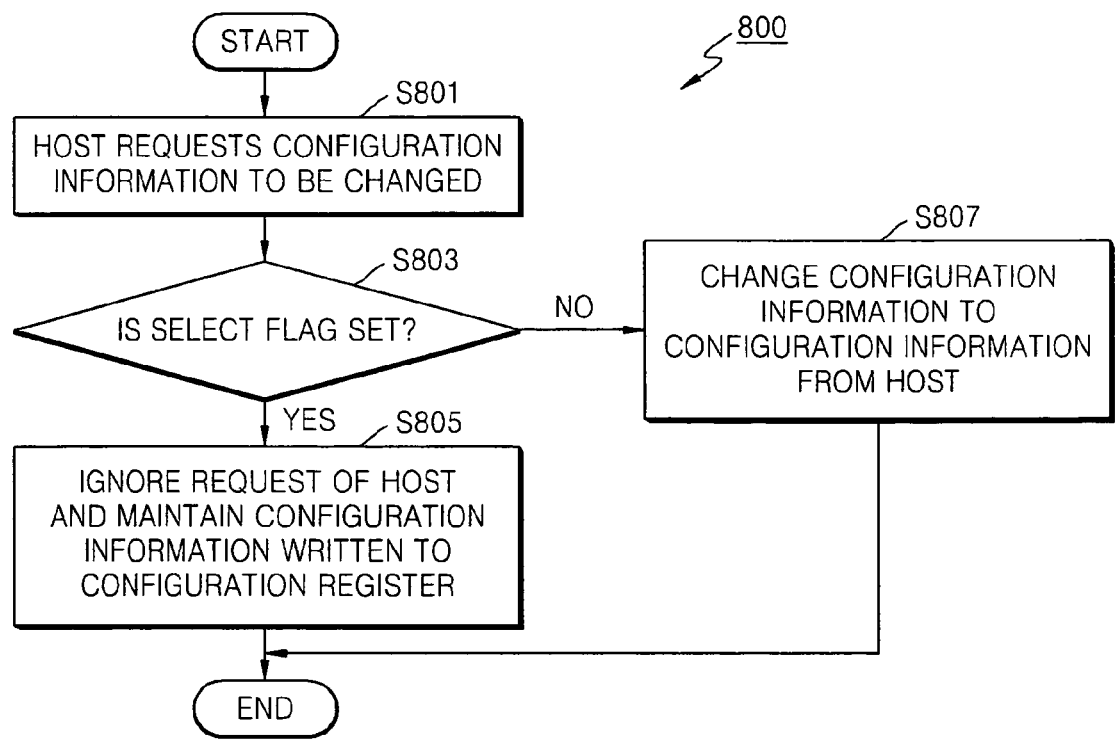
FIG. 8 is a flow chart of an operation of changing configuration information when a host requests the configuration information to be changed in the method for setting configuration information in some embodiments according to the present invention.

FIG. 8 is a flow chart of an operation of changing configuration information when a host requests the configuration information to be changed after the nonvolatile memory device powers-up in some embodiments according to the present invention. Referring to FIG. 8, when the host requests configuration information for a system to be changed after the nonvolatile memory device powers-up in operation S801, the configuration controller 150 determines whether the configuration information CFG_HOST requested by the host is written to the configuration register 130 or not in response to the select flag SEL.

Specifically, when the host requests the configuration information to be changed, the setting controller 151 judges whether the select flag SEL is set in operation S803. In some embodiments according to the present invention, the value of the configuration register 130 set after the nonvolatile memory device powers-up is maintained when the select flag SEL is set. Accordingly, the setting controller 151 can ignore the request of the host and maintains the value written to the configuration register 130 when the select flag SEL is set in operation S805.

When the select flag SEL is not set, the setting controller 151 outputs configuration information CFG1_HOST through CFGN_HOST provided by the host to the configuration register 130 to change the configuration information for a system into the configuration information CFG1_HOST through CFGN_HOST from the host in operation S807.

While the operation of the nonvolatile memory device when powering-up and the operation of processing the request of the host to change configuration information according to whether the select flag SEL is set or not have been explained, it will be understood by those of ordinary skill in the art that these operations are accomplished by constructing bits of the select flag SEL in various combinations. For example, a 2-bit select flag is used in a manner that one of the two bits is used to control the operation when the nonvolatile memory device powers-up and the other bit is used to control the operation of processing the request of the host.

Figure 4:
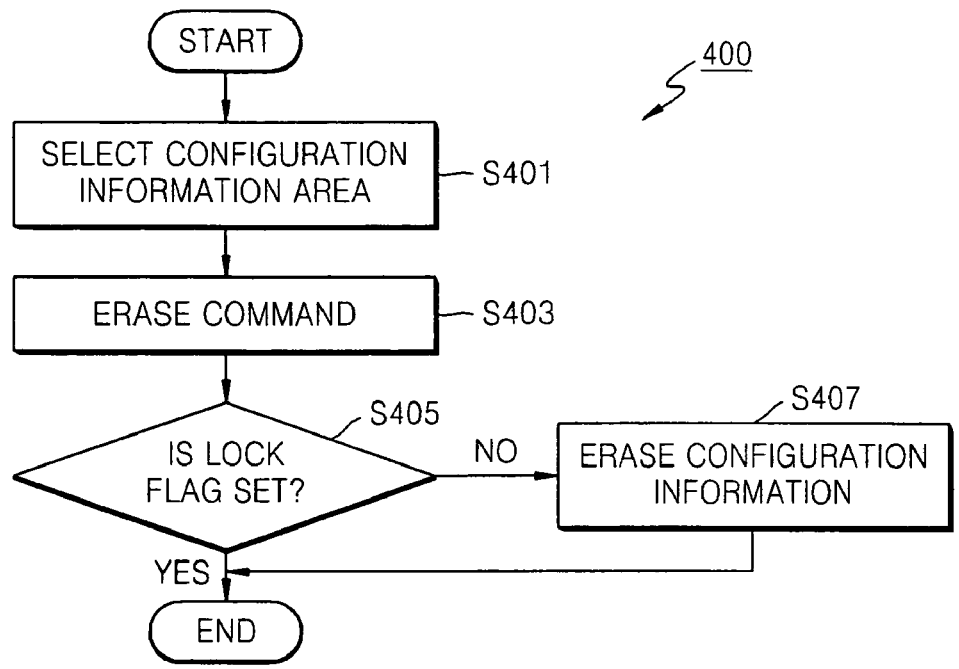
FIG. 4 is a flow chart of an operation of erasing configuration information in a method for setting configuration information in some embodiments according to the present invention.
Figure 5:
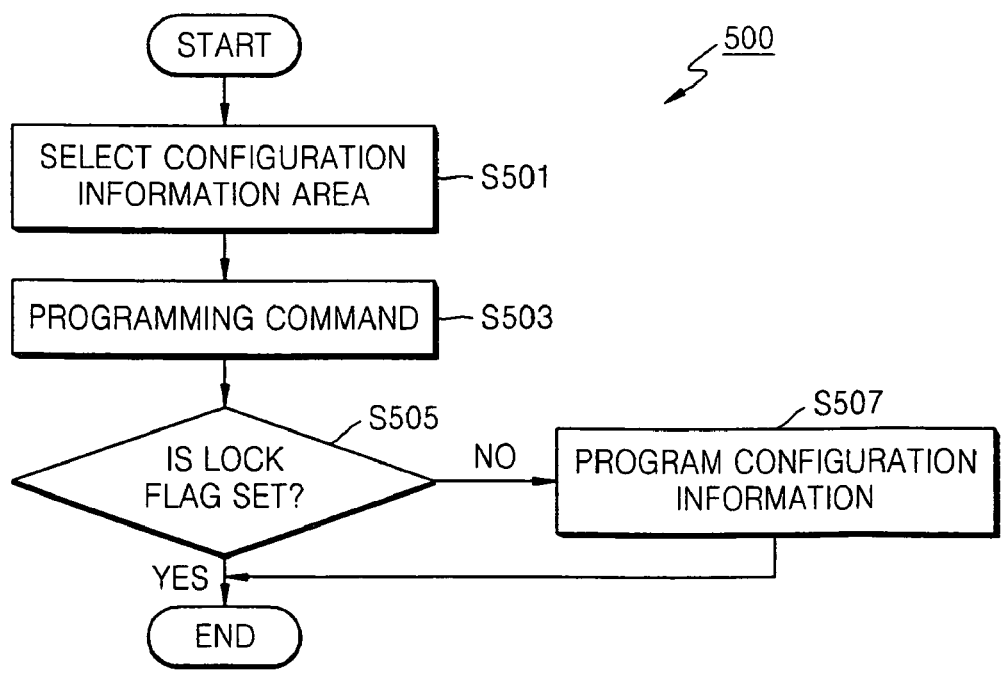
FIG. 5 is a flow chart of an operation of programming configuration information in a method for setting configuration information in some embodiments according to the present invention.

Operations of erasing and programming the configuration information area 115 of the nonvolatile memory cell array 110 will be explained with reference to FIGS. 4 and 5. FIG. 4 is a flow chart of an operation of erasing configuration information in the method for setting configuration information according to an embodiment of the present invention, and FIG. 5 is a flow chart of an operation of programming configuration information in the method for setting the configuration information in some embodiments according to the present invention.

When an erase command or a programming command with respect to the configuration information area 115 of the nonvolatile memory cell array 110 is input, the configuration controller 150 determines whether to perform the erase operation or the programming operation in response to the lock flag LOCK and carries out the erase operation or the programming operation.

The erase operation is explained first with reference to FIG. 4. The configuration information area 115 of the nonvolatile memory cell array 110 is selected in operation S401. Then, an erase command is performed on the selected configuration information area 115 in operation S503. Here, the operation controller 153 determines whether the lock flag LOCK stored in the configuration register 130 is set in operation S405.

When the lock flag LOCK is set, which indicates that the configuration information CFGINF stored in the configuration information area 115 is to be protected, the operation controller 153 ignores the input erase command and completes the operation. When the lock flag LOCK is not set, the operation controller 153 erases the configuration information CFGINF stored in the configuration information area 115 according to the erase command in operation S407.

The programming operation is explained with reference to FIG. 5. The programming operation is similar to the erase operation.

The configuration information area 115 of the nonvolatile memory cell array 110 is selected in operation S501. Here, the operation controller 153 determines whether the lock flag LOCK stored in the configuration register 130 is set in operation S505.

When the lock flag LOCK is set, which indicates that the configuration information CFGINF stored in the configuration information area 115 is to be protected, the operation controller 153 ignores the input programming command and completes the operation. When the lock flag LOCK is not set, the operation controller 153 programs new configuration information input with the programming command to the configuration information area 115 in operation S507.

While the operation of the configuration controller 130 to set configuration information according to whether the select flag SEL is set or not has been explained, the present invention can be constructed such that the configuration controller 130 sets the sub configuration information CFG1 through CFGN stored in the configuration information area 115 of the nonvolatile memory cell array 110 as configuration information according to whether the lock flag LOCK is set to lock the configuration information.

For example, when the lock flag LOCK is set, the setting controller 151 outputs the sub configuration information CFG1 through CFGN stored in the configuration information area 115 to the configuration register 130 when the nonvolatile memory device powers-up to set the sub configuration information CFG1 through CFGN as the configuration information irrespective of the select flag SEL. Even when a host requests the configuration information to be changed, the setting controller 151 ignores the request of the host and maintains the configuration information stored in the configuration register 130 (that is, the sub configuration information CFG1 through CFGN stored in the configuration information area 115 during powering-up).

While the method for setting the configuration information has been described, the present invention can be applied to set region setting information for setting a single-bit region and a multi-bit region of a nonvolatile memory cell array. In this case, the nonvolatile memory cell array includes a nonvolatile memory cell array, a region setting register and a region setting controller.

The nonvolatile memory cell array can change the single-bit region to the multi-bit region or change the multi-bit region to the single-bit region. The region setting register stores region setting information of the single-bit region and the multi-bit region. The region setting controller sets the region setting information to the region setting register in response to a select flag stored in the nonvolatile memory cell array.

While the operation for setting configuration information can be carried out in the nonvolatile memory device using the method according to the aforementioned embodiment, the operation can be performed in the system using the nonvolatile memory device. In this case, the operation of setting region setting information is performed by a configuration information setting device included in the system. The configuration information setting device includes a configuration register storing configuration information and a configuration controller. The configuration controller sets the configuration information using configuration information stored in a configuration information region of a nonvolatile memory cell array.

As described above, the nonvolatile memory device according to the present invention can maintain configuration information when security is required by maintaining the configuration information using the select flag and the lock flag. Furthermore, the present invention can prevent configuration information from being wrongly changed to prevent erroneous operation of the nonvolatile memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nonvolatile memory device comprising:
   a nonvolatile memory cell array;
   a configuration register; and
   a configuration controller configured to set configuration information for the nonvolatile memory cell array in the configuration register in response to a select flag stored in the nonvolatile memory cell array.

2. The nonvolatile memory device of claim 1, wherein the nonvolatile memory cell array comprises a configuration information area, and the configuration information area comprises a select flag region configured to store the select flag.

3. The nonvolatile memory device of claim 1, wherein the configuration information includes region setting information for setting a single-bit region and a multi-bit region in the nonvolatile memory device.

4. A nonvolatile memory device comprising:
   a nonvolatile memory cell array;
   a configuration register; and
   a configuration controller configured to set configuration information for the nonvolatile memory cell array in the configuration register in response to a select flag stored in the nonvolatile memory cell array, wherein the nonvolatile memory cell array comprises a configuration information area, and the configuration information area comprises a select flag region configured to store the select flag, wherein the configuration information area further comprises:
   at least one sub configuration information region respectively storing at least one sub configuration information; and
   a lock flag region storing a lock flag.

5. The nonvolatile memory device of claim 4, wherein the configuration register comprises:
   at least one sub configuration register corresponding to the at least one sub configuration information region;
   a select flag register corresponding to the select flag region; and
   a lock flag register corresponding to the lock flag region.

6. The nonvolatile memory device of claim 4, wherein the configuration controller is configured to, upon power-up of the nonvolatile memory device, read the at least one sub configuration information, the select flag and the lock flag of the configuration information area and configured to store one of the at least one sub configuration information and default configuration information based on the state of the select flag.

7. The nonvolatile memory device of claim 6, wherein, when a host requests the configuration controller to change configuration information after the nonvolatile memory device has powered-up, the configuration controller is configured to determine whether the configuration information is changed at the request of the host based on the state of the select flag.

8. The nonvolatile memory device of claim 4, wherein, when an erase command or a programming command with respect to the configuration information area is input, the configuration controller determines whether to perform an erase/programming operation according to the inputted command or not based on the state of the lock flag.

9. The nonvolatile memory device of claim 4, wherein the configuration controller comprises:
   an operation controller performing a read operation, an erase operation and a programming operation on the configuration information region; and
   a setting controller outputting the configuration information to the configuration register.

10. The nonvolatile memory device of claim 9, wherein the setting controller comprises at least one sub setting controller that corresponds respectively to at least one sub configuration register corresponding to the sub configuration information region and outputs the sub configuration information to the corresponding sub configuration register in response to the select flag.

11. A method for setting configuration information for a non-volatile memory device, the method comprising:
- reading configuration information stored in a configuration information area of a nonvolatile memory cell array; and
- setting configuration information based on the state of a select flag included in the read configuration information.

12. The method of claim 11, wherein the select flag is stored in a select flag region of the configuration information area.

13. The method of claim 12, wherein the configuration information area stores at least one sub configuration information and a lock flag, the at least one sub configuration information is respectively stored in at least one sub configuration information region of the configuration information area, and the lock flag is stored in a lock flag region of the configuration information area.

14. The method of claim 11, further comprising setting one of at least one sub configuration information included in the read configuration information and default configuration information as configuration information based on the state of the select flag when power is supplied.

15. The method of claim 11, further comprising determining whether configuration information requested by a host is to be set as the configuration information based on the state of the select flag when the host requests the configuration information to be changed after power is supplied.

16. The method of claim 11, wherein, when an erase command or a programming command with respect to the configuration information area is input, it is determined whether an erase/programming operation according to the inputted command is performed or not based on the state of the lock flag included in the configuration information.

17. The method of claim 11, wherein the configuration information includes region setting information for setting a single-bit region and a multi-bit region in the nonvolatile memory cell array.

18. A nonvolatile memory device comprising:
- a nonvolatile memory cell array configured to change a single-bit region to a multi-bit region and/or configured to change the multi-bit region to the single-bit region;
- a region setting register configured to store region setting information of the single-bit region and the multi-bit region; and
- a region setting controller configured to provide the region setting information to the region setting register based on the state of a select flag stored in the nonvolatile memory cell array.

* * * * *